US009230056B1

(12) United States Patent
Stolberg

(10) Patent No.: US 9,230,056 B1
(45) Date of Patent: Jan. 5, 2016

(54) SYSTEM TESTING TECHNIQUES

(71) Applicant: Amazon Technologies, Inc., Reno, NV (US)

(72) Inventor: Sean Edward Stolberg, Duvall, WA (US)

(73) Assignee: Amazon Technologies, Inc., Reno, NV (US)

(*) Notice: Subject to any disclaimer, the term of this patent is extended or adjusted under 35 U.S.C. 154(b) by 535 days.

(21) Appl. No.: 13/669,290

(22) Filed: Nov. 5, 2012

(51) Int. Cl.
| | |
|---|---|
| *G01P 21/00* | (2006.01) |
| *G06F 19/00* | (2011.01) |
| *G01R 31/02* | (2006.01) |
| *G01R 31/12* | (2006.01) |
| *G01R 31/28* | (2006.01) |
| *G01R 27/18* | (2006.01) |
| *G06Q 30/02* | (2012.01) |
| *G06F 15/16* | (2006.01) |

(52) U.S. Cl.
CPC ............... *G06F 19/00* (2013.01); *G01R 27/18* (2013.01); *G01R 31/025* (2013.01); *G01R 31/12* (2013.01); *G01R 31/2825* (2013.01); *G06F 15/16* (2013.01); *G06Q 30/02* (2013.01)

(58) Field of Classification Search
CPC .. G01R 31/025; G01R 31/12; G01R 31/2825; G01R 27/18; G06F 19/00; G06Q 30/02
USPC .......... 702/119, 120, 123, 108; 705/10, 7.32; 434/350
See application file for complete search history.

(56) References Cited

U.S. PATENT DOCUMENTS

| | | | | |
|---|---|---|---|---|
| 6,745,146 B1* | 6/2004 | Brown et al. | ................. | 702/123 |
| 2002/0099591 A1* | 7/2002 | Dyer | ............................. | 705/10 |

OTHER PUBLICATIONS

Dean, Jeffrey and Sanjay Ghemawat. "MapReduce: Simplified Data Processing on Large Clusters." [online] 2004 [retrieved on Nov. 6, 2012]. Retrieved from the Internet: <URL: http://static.googleusercontent.com/external_content/untrusted_dlcp/research.google.com/en/us/archive/mapreduce-osdi04.pdf>.

* cited by examiner

*Primary Examiner* — John H Le
(74) *Attorney, Agent, or Firm* — Lee & Hayes, PLLC

(57) ABSTRACT

A pool of test entities, such as test users and test products, is maintained. Parameters for test entities may be received and test entities may be selected from sets of test entities satisfying the parameters. Selection of a test entity from a set of test entities satisfying received parameters may utilize stochastic techniques. When multiple tests are administered simultaneously, test entities may be provided in a manner that ensures that one test does not affect the validity of another test due to the test's activity in connection with the test entities.

24 Claims, 10 Drawing Sheets

SYSTEM TESTING TECHNIQUES

BACKGROUND

Testing is an important aspect of effective system utilization. An organization's successful operations, for example, often rely heavily on its ability to engage in transactions over the Internet and/or other communications networks. Further, modern systems are often quite complex, comprising numerous subsystems and utilizing vast amounts of data. Even ordinary transactions, such as purchases of products in an electronic marketplace, can require the collective operation of various subsystems for the transactions to be successful. Minor coding errors in a subsystem can cause various problems throughout a system, such as poor customer experiences and the failure of transactions to be completed. Moreover, as the complexity of such systems increases, it becomes more difficult to test the systems to ensure that they operate properly.

BRIEF DESCRIPTION OF THE DRAWINGS

Various embodiments in accordance with the present disclosure will be described with reference to the drawings, in which.

DETAILED DESCRIPTION

Figure 1:
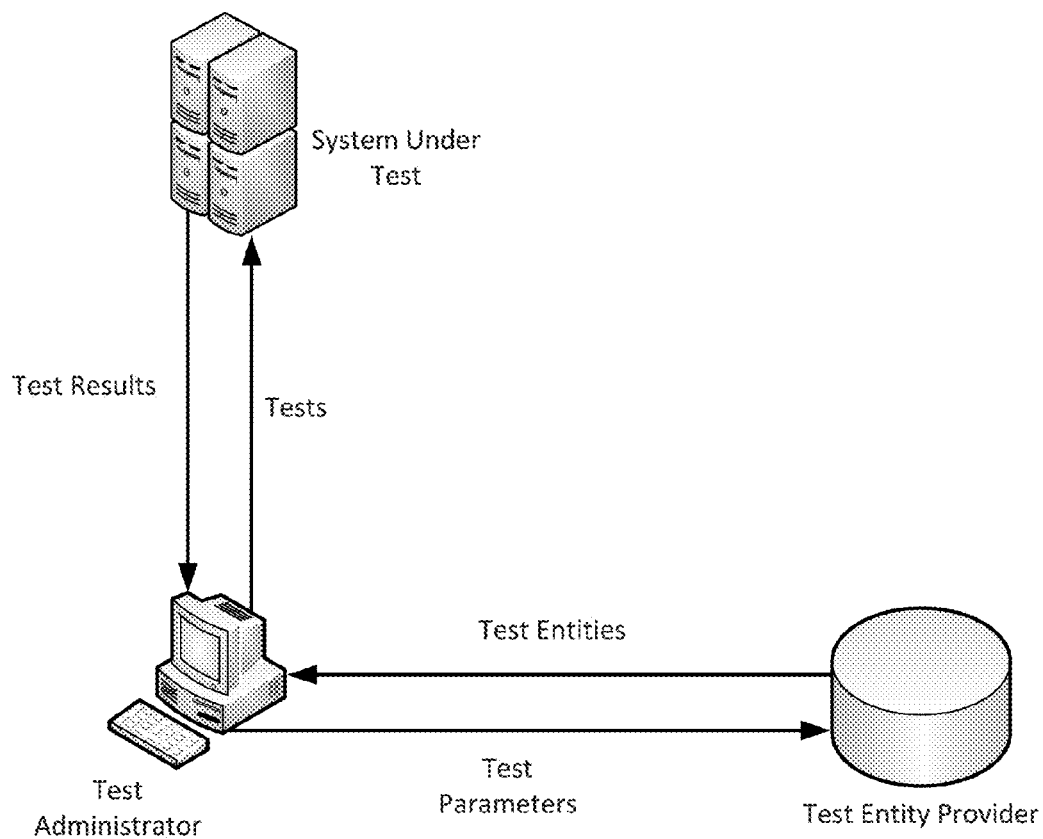
FIG. 1 shows a diagram illustrating administration of test to a system in accordance with at least one embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments of the present disclosure include techniques for providing test entities for use in system tests. A test entity may be a collection of information representing an entity involved in operation of a system. As one example, a test entity may be a test user, representing a user of the system. As another example, a test entity may be a test product, representing an item offered for consumption in an electronic marketplace. Example products include consumer goods, digital audio and/or video content, services orderable through an electronic marketplace and/or other items offered for consumption. Example products also include computing resources hosted by an organization for use by customers of the organization. Example computing resources include various data storage services, computer system services and other services. In many instances, the products may be hosted by the organization and programmatically and remotely managed by customers of the organization. A customer may, for instance, use an interface of the organization (e.g., a console provided through a web interface) to order computing resources to build a network for its operations. Control of the computing resources may be provided through web service or other electronic calls. Test entities may represent fictional or actual entities. Test users, for example, may represent fictional users of a system. A test user may, for example, have a user identifier used by the system regardless of whether the test user corresponds to a real or fictional user. Test products may correspond to actual and/or fictional products offered for consumption in an electronic marketplace implemented by the system. Test entities may also include various associated data, such as attributes, authentication credentials (e.g., username/password) and/or other relevant associated data. Further, some test entities of a test entity type may have different amounts of associated information. For example, some test users may have associated authentication credentials while others may not. The test users with authentication credentials may be used for tests having a goal of ensuring that authenticated users are able to engage in certain transactions with the system. The test users without authentication credentials may be used for tests having a goal of ensuring that new users are able to set up accounts with the system. The amount of associated information for test entities of a test entity type may also vary in other ways.

In various embodiments of the present disclosure, a pool of test entities available for use in system testing is maintained. There may be several pools, such as a pool for each of a plurality of test entity types. There may be, for example, a pool of test users, a pool of test products and/or pools of other types of test entities. Parameters for a test may be received and used to select from a pool of test entities. The parameters may be received in a variety of contexts. For example, a user designing a test may provide parameters for a test entity needed for the test to allow the parameters to be used for selection of an appropriate test entity. As another example, a system administering a test on a system may provide the parameters at test runtime, i.e., when the test is running. The parameters may specify one or more attributes of a test entity needed for a test and the parameters may vary among different instances of providing the parameters. For instance, one set of parameters may specify that a test user that be subscribed to a product (i.e., any product). Another set of parameters may specify a test user subscribed to a particular product (e.g., a product specified by the parameters). Yet another set of parameters may specify a test user subscribed to a product, but having certain other information, such as specified demographic information, a credit card or other payment method on file with the system, a particular status (e.g., a particular level in a customer loyalty program or purchased support level) and/or other information. As noted, the parameters may also specify attributes relating to the state of a user maintained in a system. Example states include subscription states, customer loyalty program level, paid support level, authentication state (e.g., whether authenticated with a system and/or a subsystem) and/or other states.

Upon receipt of parameters, the parameters may be used to select from a pool of test entities satisfying the parameters. For instance, a subset of a pool of test entities that satisfy the parameters may be selected. The subset may be all test entities satisfying the parameters or less than all. The subset may be treated as a probabilistic data set for the purpose of selecting a number of needed test entities from the subset. For example, if one test entity is needed, a test entity may be randomly selected from the subset. Similarly, if N (N a positive integer) test entities are needed, N test entities may be randomly selected from the subset. Selection from the subset may be truly random (or pseudo random) or may be performed according to a probability distribution. Selection of test entities may also include using stochastic methods to populate attributes of selected test entities. For instance, a test entity may be provided missing one or more necessary attributes. Data for the attributes may be determined stochastically. For example, if a birthdate of a test user is not provided, a birthday may be provided. The day of the year, for example, may be randomly selected and the year may be selected using a probability distribution. Names, addresses and/or other information may also be provided for the test entities stochastically.

Upon having been provided a test entity satisfying the parameters or having selected from multiple test entities satisfying the parameters, the test entity may be used in a test on a system. The test may involve simulation of various transactions with the system. For example, if the test entity is a test user, input may be provided to the system as if the user was a real user providing the input himself/herself. As one illustrative example, to simulate a test user clicking on a hyperlink of a webpage, a system administering a test may submit a hypertext transfer protocol (HTTP) request on behalf of the test user along with any relevant information about the user (e.g., a cookie or other value that enables the system to associate the request with the test user). Similarly, input may be provided to the system to simulate other types of input by a test user, such as API calls to cause the system to perform various operations. Input to the system may include authentication information, such as an electronic signature of a request that enables the system to associate the test user with the request and to operate as if the test user is authenticated with the system and has submitted an authentic request. Further, the test may follow a script which includes multiple stages of input, which may vary depending on how the system responds to the input during a test.

FIG. 1 shows a diagram illustrating various embodiments of the present disclosure. In FIG. 1, a test administrator administrates tests on one or more systems under test. The test administrator may be a user utilizing a computing device to interact with the system under test according to various tests designed by the test administrator. The test administrator may, for example, cause the system under test to execute various functions, perform various operations and/or otherwise process information. The results of the test, such as information indicating how the system under test has performed, may be provided by the system under test to the test administrator. For example, various tests administered to the system under test may cause the system under test to operate in a certain way and/or store certain types of information. Information stored by the system under test may be requested and received by the test administrator. Similarly, the tests may involve the system under test providing certain information in response to requests from the test administrator pursuant to a test being administered. As one example, the system under test may request a particular document through an interface provided by the system under test. The test administrator may receive a document in response and/or a message indicating an error from the system under test. If the document was received, the test administrator may analyze the document (and/or an identifier, such as a name of the document) to determine whether the document was correctly provided. Other examples appear below.

In order to administer tests on various systems under test, the test administrator may utilize a test entity provider. The test entity provider may be a computer system having stored therein various test entities usable in system tests. A test entity may be a logical entity that corresponds to an actual or fictitious entity. As one example, a test entity provider may store records corresponding to various users, who may be fictitious users. A test may, for example, include simulating input from a user to a system under test in order to determine whether the system under test operates correctly. A test may, for example, include providing input to a system under test to determine whether actual users are able to engage in certain transactions, such as ordering items for consumption, launching computing resource instances, subscribing to and/or unsubscribing from items offering and/or requiring subscription and/or other transactions.

Other entities may also be provided by a test entity provider. For example, a system under test may be a system that implements an electronic marketplace accessible over public communications networks such as the Internet. The test entity provider may provide items offered for consumption in the electronic marketplace. A test may involve accessing from the system under test information about the item. In order to obtain test entities from the test entity provider, a test administrator may provide test parameters to the test entity provider and the test entity provider may provide one or more test entities suitable for use according to the parameters that were provided. For instance, test parameters may indicate the need for a user who has subscribed to a particular service offered by the system under test. The test entity provider may provide one or more users that are subscribed to the specified service.

By providing a test user, it should be understood that, in various embodiments, providing the test user includes providing information about the test user that is usable to simulate input from the user. The information about the test user may, for example, include an identifier of the test user utilized by the system under test and various attributes of the test user. The attributes may, for example, include information typically stored about users such as demographic information. The information may also include other information such as authentication information (e.g., username, password, digital certificate and/or key) to allow a system simulating input from the test user to authenticate with the system under test and/or otherwise interact with the system under test according to authentication and validation requirements of the system.

The test entity provider may provide test entities to the test administrator in various ways. For example, in some embodiments, the test entity provider provides a pool of test entities satisfying parameters that were received. The test administrator may accordingly select one or more test entities from the provided test entities. As another example, the test entity provider may provide a number of test entities specified by the test administrator in the test parameters. For example, if the test parameters include a need for two users having particular properties, the test entity provider may provide two users. Selection of the test entities from a pool of test entities may, therefore, be performed by the test entity provider. Similarly, the test entity provider may select from a set of acceptable test entities and provide the selected test entities to the test administrator who performs further selection.

Whether selected by the test entity provider, a test administrator, both or another device, a pool of acceptable test entities may be selected stochastically. For instance, a pool of test entities satisfying the test parameters may be identified. Test entities may be randomly or otherwise selected from the pool. In this manner, the test administrator does not need to hard code test entities into tests that the test administrator designs.

It should be noted that FIG. 1 is simplified for the purpose of illustration of various aspects of the present disclosure and numerous variations are considered as being within the scope of the present disclosure. For example, FIG. 1 shows a test entity provider being separate from the test administrator. The test entity provider, however, may be implemented as part of the test administrator and/or a component thereof. Similarly, the test administrator is shown as a single device. That is, a tester, a user of the test administration system, may utilize the test administrator to design and administer tests. However, the test administrator may be a more complicated system having numerous components which may involve separate computing devices. For instance, in some embodiments, a separate device is used to design tests and one or more other devices may be used to administer a test. Such configurations may be useful, for example, when a single device is unable to administer the test effectively. For instance, a test may involve applying a certain amount of load to a system under test. If a system under test is sufficiently large, the test administrator may be unable to apply the proper load and, as a result, one or more additional devices may be required for application of the load. Similarly, a test may involve interaction with a system by multiple different devices, each having different network addresses. Such tests may be administered by different systems from those used to design the tests.

Figure 2:
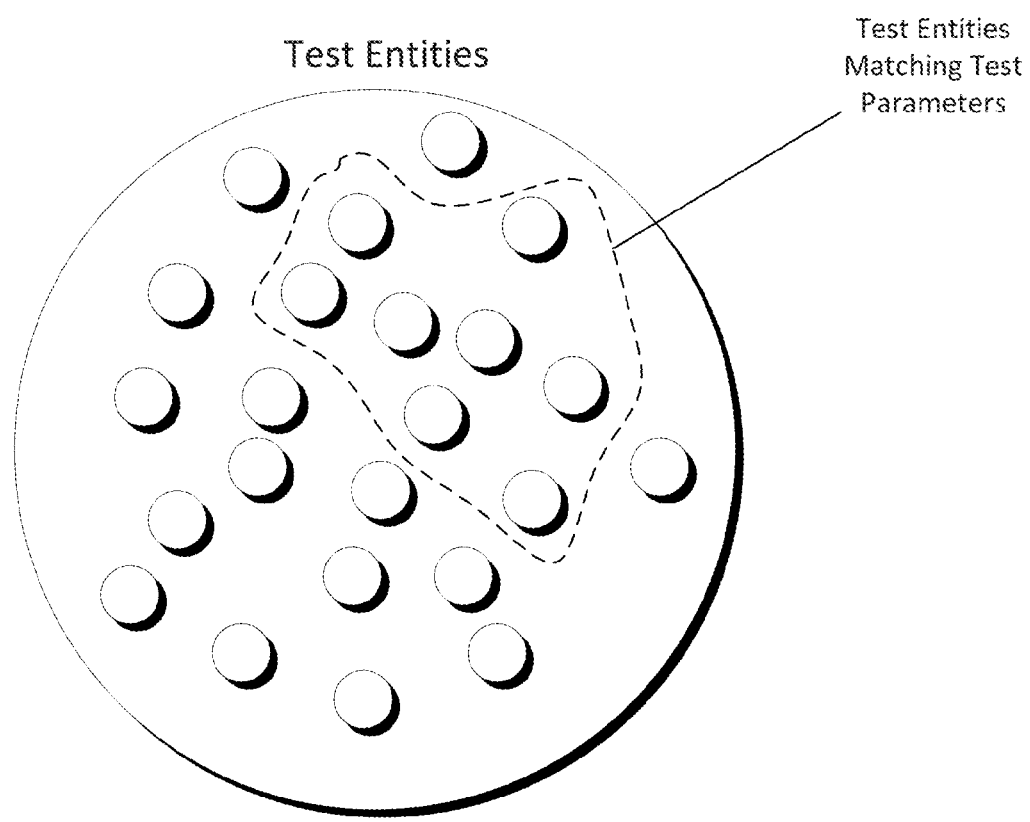
FIG. 2 shows a diagram of an illustration of selection of test entities matching a set of parameters in accordance with at least one embodiment.

FIG. 2 illustrates one way in which a test entity provider may select test entities. In an embodiment, the test entity provider maintains a pool of reconfigured test entities of a particular test entity type represented by the dots inside the circle of FIG. 2. Such pools may be maintained for multiple types of test entities. For example, as noted above, a test entity may be a test user and, therefore, the pool illustrated in FIG. 2 may be a pool of test users. A test entity may also be a test product, that is, a product offered for consumption in an electronic marketplace. Generally, test entities may be any logical entity which may be used in a test on a system. In addition, test entities may be complex in the sense that a test entity may include various attributes and/or subattributes. For example, a test user may have a user identity corresponding to an account in a system to be tested. The identity or another identity of the test user may be used for a subaccount of the system. Test entities may also include attributes such as first names, last names, addresses, phone numbers, email addresses and/or other information. In addition, test entities may also states maintained by a system to be tested. For instance, the system to be tested may implement an electronic marketplace that offers subscriptions to various products. Whether or not a test user is subscribed to a particular product may be a state maintained by the system and the state of a test user may be tracked by a product provider that stores the state using a value of an attribute stored for the test user. As another example, some test users may have accounts in a system and other test entities may not. A test user without an account in the system may be used, for example, to test whether the system enables new users to create accounts and/or otherwise engage in transactions available to users without accounts. Test users with accounts may be used, for example, to test whether a system enables test users with accounts to engage in certain transactions for users having accounts. Transactions include subscribing, purchasing, downloading and/or otherwise engaging in transactions with a system.

As noted above, parameters for a test may be used to select from a pool of test entities. Accordingly, as illustrated in FIG. 2, parameters for a test are used to identify a subset of test entities of the pool that are acceptable for use in a test according to the parameters. As illustrated by a dotted line surrounding a subset of the test entities in the pool, a subset of the test entities (which may be a nonempty proper subset) may satisfy certain parameters. As an illustrative example, parameters for a test may indicate that a user be subscribed to a product (which may be any product). Acceptable test entities, represented as test entities surrounded by the dotted line, may be those test entities satisfying parameters for the test. Thus, continuing the present example, the test entities surrounded by the dotted line in FIG. 2 may be test entities that are subscribed to a product. The product to which test entities subscribe may vary among the test entities. For instance, one test entity may subscribe to one product and another test entity may subscribe to another product. As another example, parameters for a test may specify subscription to a particular product as a requirement. Accordingly, the test entities surrounded by the dotted line in FIG. 2 may be those test entities that are subscribed to the particular product.

A number of test entities needed for the test may be selected from the identified subset. In various embodiments, selection may be performed in various ways. For instance, various embodiments of the present disclosure utilize stochastic selection from a pool of acceptable test entities. For instance, referring to the test entities surrounded by the dotted line in FIG. 2, one or more test entities needed for a test may be randomly selected from the subset represented by the test entities surrounded by the dotted line.

Other ways of stochastically selecting test entities for use in tests may also be used. For example, one alternative to that described above in connection with FIG. 2 illustrated in FIG. 2 would be to create a random sequence of test entities and proceed through the sequence, selecting the first test entity that satisfies the parameters for the test. Other ways of stochastically selecting test entities may also be used. In addition, test entities may also be associated with a non-trivial probability distribution such that some test entities are more likely to be selected than other test entities. The test distribution may be, for example, based at least in part on past measurements with respect to operations of a system being tested. As a more concrete example, if the test entities are products offered for consumption in an electronic marketplace implemented by a system, products that are more often consumed may be more likely to be selected for use in a test. In this manner, tests may be designed to test operations of a system that are more likely to affect a greater number of users of the system.

Figure 3:
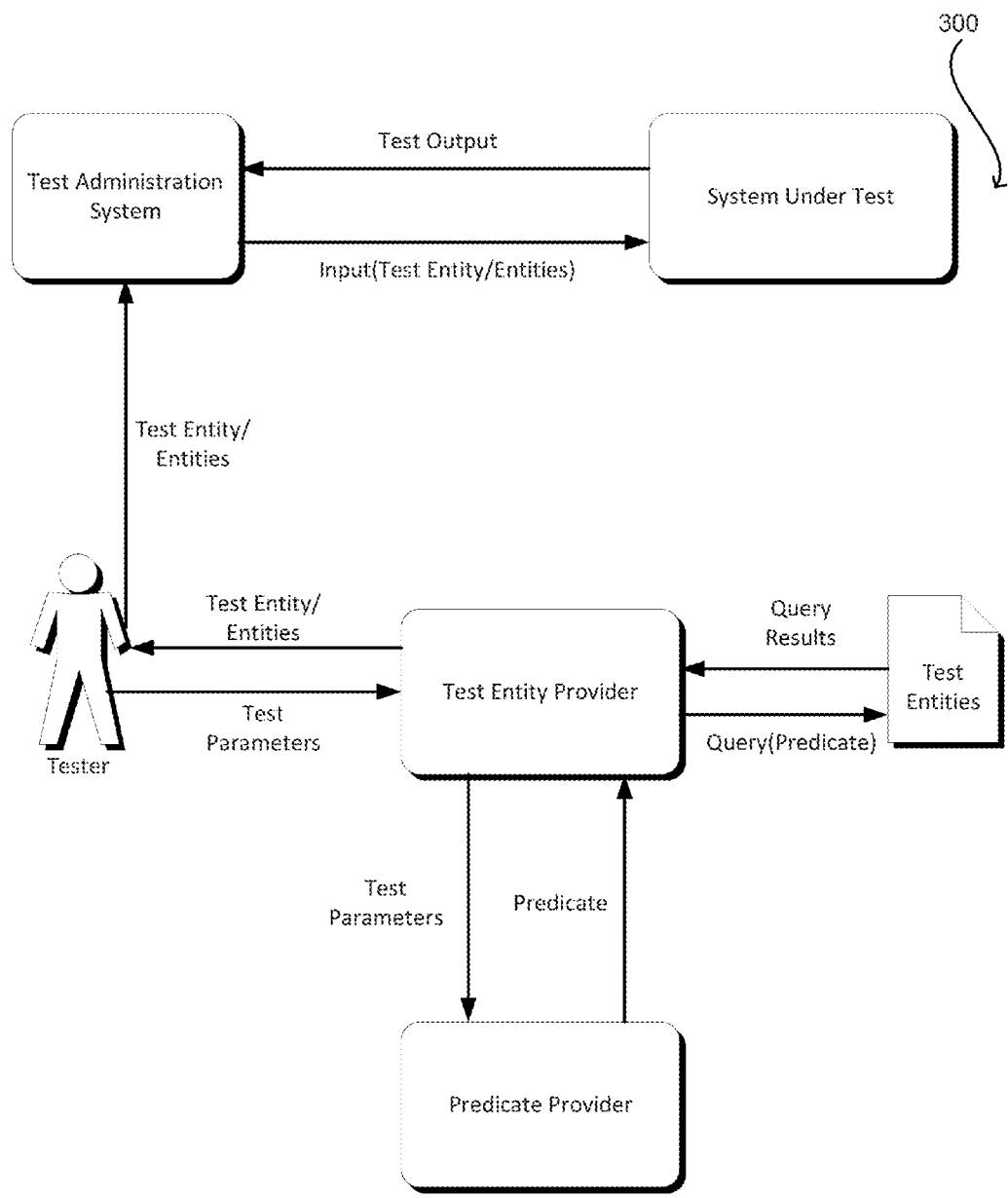
FIG. 3 shows an illustrative example of an environment in which various embodiments may be implemented.

As noted, various embodiments of the present disclosure may be implemented in a wide variety of environments. FIG. 3 shows an illustrative example of such an environment 300 which may be used to implement various embodiments of the present disclosure. The environment 300 may be used, for example, to implement embodiments described above in connection with FIG. 1 and elsewhere described herein. As illustrated in FIG. 3, a tester utilizes various components of the environment 300 in order to administer a test to a system, which is referred to in FIG. 3 as a system under test. It should be noted that, by referring to a system as a system under test, the system may not actually be under test at the time various operations are performed. In other words, use of the term system under test does not necessarily imply that the system is being tested during all operations discussed herein. Further, it should be noted that, while FIG. 3 illustrates a user, a user may interact with various components of the environment 300 through a suitable user device which is not illustrated. The user may, for example, use a laptop computer network computer, tablet computing device, mobile computing device and/or any suitable device or collection of devices in order to interact with the environment 300. Accordingly, it should be understood that, unless otherwise clear from context, information received from the tester or another user for that matter, may be received via a device being utilized by a tester or a user.

The system under test can vary according to the various embodiments. For example, many embodiments described herein in connection with an electronic marketplace are implemented by a system, where the system provides a web interface to the electronic marketplace. Other systems may also be tested in accordance with the various embodiments, such as an organization's internal systems used for its internal operations, such as personnel management, human resources, accounting, and the like. In addition, a system under test may be a production system (i.e., a system in actual use for an organization's operations). The system under test may also be a pre-production system that is configured based at least in part on a production system, but which is used for testing purposes, such as to test various proposed updates (e.g., hardware updates and/or code updates) to the production system before the proposed updates are applied to the production system. Systems under test may also be proposed systems that are being tested for the purpose of offering items for consumption in a commercial environment.

As illustrated in FIG. 3, the tester provides parameters for a test (test parameters) to a test entity provider. The test entity provider may be a computer system or component thereof that receives test parameters and provides one or more test entities in accordance with the test parameters such as described above and in more detail below. The test entity provider may provide the test parameters to a predicate provider, which may be configured to generate a predicate based at least in part on the received test parameters. As with the test entity provider, the predicate provider may be a computer system or component thereof configured to perform operations described herein. In addition, while illustrated as a separate component from the test entity provider, variations are considered as being within the scope of the present disclosure. For example, in some embodiments, the predicate provider is a subcomponent of the test entity provider. This may be implemented in numerous ways. For example, the test entity provider may operate as a programming module and the predicate provider may be implemented as a submodule of the programming module. In some embodiments, the test entity provider and predicate provider are implemented using the Java program language. The test entity provider may be implemented using a Java class and the predicate provider may be implemented as a subclass of the class.

Other variations are also considered as being within the scope of the present disclosure. For example, the predicate provider and test entity provider may be implemented using different computer systems. The test entity provider may interact with the predicate provider via web services and/or application programming interface (API) calls. Similarly, while illustrated as separate from the tester—that is, separate from the device of the tester—the test entity provider and/or predicate provider may be implemented on the same device utilized by the tester.

Returning to the description of FIG. 3, as noted, the predicate provider receives test parameters and provides in response a predicate based at least in part on the test parameters. The predicate, in an embodiment, may be the basis of a query used to identify suitable test entities that satisfy the test parameters. Predicates may be obtained using various tools, such as predicates implemented using predicate classes of the Google Guava libraries, offered by Google, Inc. A test entity provider may receive a predicate from the predicate provider and submit a query that is based, at least in part, on the predicate to be executed against a set of test entities. As illustrated in FIG. 3, available test entities are encoded in a document such as an extensible markup language (XML) document. Using XML, test entities may be encoded as XML elements having sub-elements encoding attributes of the test entities. Sub-elements may themselves have sub-elements that define attributes of attributes. Accordingly, the predicate may be used as the basis of an XPath query to be executed by a suitable query engine, such as EXPath, JQuery, or another suitable query engine. Queries may also be different types of queries depending on how pools of test entities are maintained. For example, test entities may be maintained using a relational database. A suitable query may be, for example, a structured query language (SQL) query configured to locate in the database suitable test entities according to the parameters. Generally, any tool for identifying suitable test entities according to the parameters may be used.

In an embodiment, the test entity provider queries a set of test entities, using a query that is based, at least in part, on the predicate provided from the predicate provider. Query results are then obtained by the test entity provider, which may provide the test entity or test entities to the tester. As noted, selecting the test entities may be performed in various ways and/or by various components of the environment 300. For instance, the query results may be provided to the tester who may select test entities from the query result. As noted above, in various implementations, the test entity provider, a test administrator, or another device may select from results matching the query.

In an embodiment, when the tester has obtained one or more test entities from the test entity provider, the one or more test entities may be provided to a test administration system. The test administration system may be a system configured to administer a test to the system under test. The one or more test entities may be provided to the test administration with a script of the test to be performed. The script may include actions that are performed as part of the administration of the test. The test administration system then may provide input to the system under test, according to a script for the test, and obtain output of the test in any suitable manner. Providing input to the system under test from the test administration system may be done in any suitable way. For example, if the test involves a test user, the input may simulate input from the test user. Thus, the test administration system may submit requests and other electronic information to the system under test as if the test user were providing input to its own computing device. As one illustrative example, to simulate navigation on a web page, the test administration system may submit a hypertext transfer protocol (HTTP) request to the system under test as if a real user had clicked on a hyperlink or otherwise interacted with a graphical user interface to cause the HTTP request to be transmitted. A test may involve several stages of input, such as to simulate user navigation through an interface. For example, a test may simulate user navigation from a home page of a web interface to another page, which may involve navigation through one or more intermediate pages. Tests may also include providing user input to interfaces, such as by providing textual input for fields, selection of checkboxes, radio buttons and/or other interface controls. The system under test may collect information from the system under test as output. The test administration may analyze the test output from the system under test and/or may provide the test output to another system for analysis. As with other components, while illustrated as separate from the tester in FIG. 3, may be part of the computer system utilized by the tester.

Figure 4:
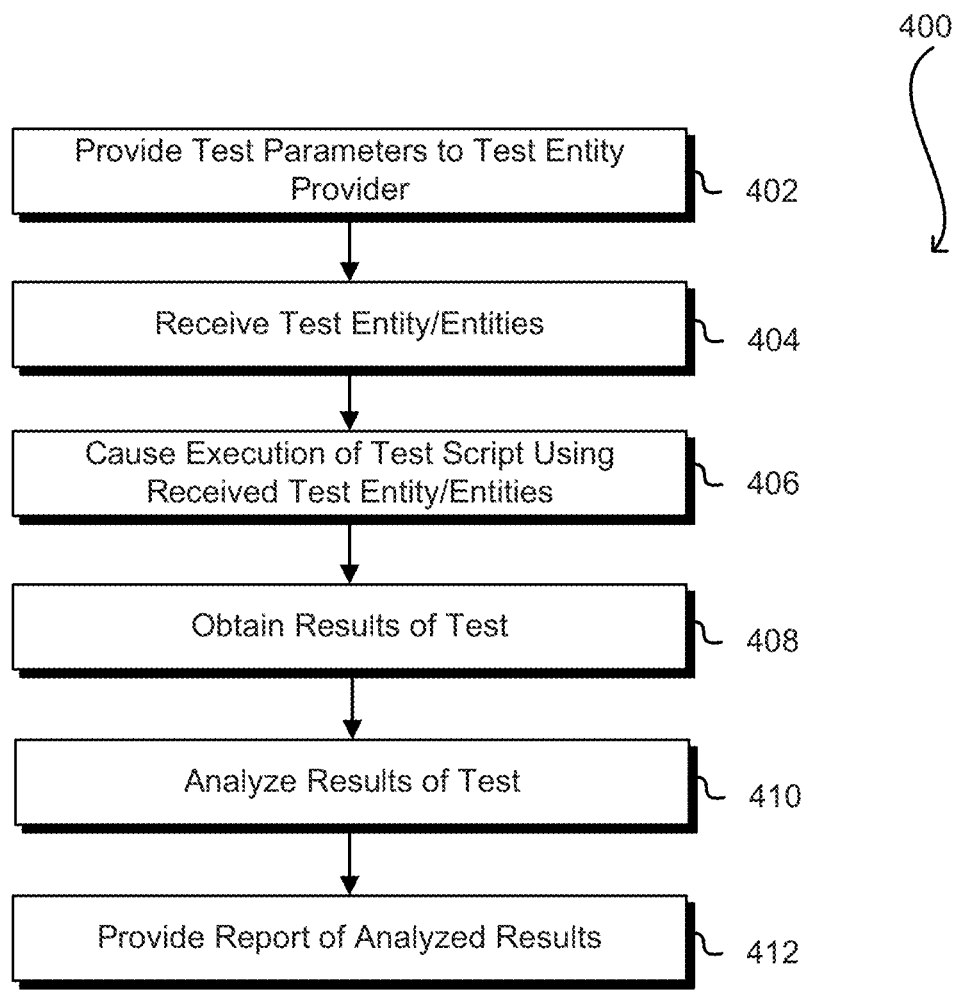
FIG. 4 shows example steps of an illustrative example of a process for testing a system in accordance with at least one embodiment.

FIG. 4 shows an illustrative example of a process 400 for testing a system in accordance with various embodiments. The process may be performed by a computing device, such as a device utilized by a tester as discussed above in connection with FIG. 3. Some or all of the process 400 (or any other processes described herein, or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

In an embodiment, the process 400 includes providing 402 test parameters to a test entity provider. For example, referring to FIG. 3, the tester may provide test parameters to a test entity provider such as described above. The test parameters may be provided to the test entity provider in a variety of contexts. For instance, in some embodiments, a tester may be in the process of designing a test and may need one or more test entities for use in the test. As another example, the test may have already been designed and as part of executing the test, the test parameters may be provided to the test entity provider as part of administration of the test. Generally, the test parameters may be provided to the test entity provider in any suitable context in accordance with various embodiments.

The process 400 in an embodiment includes receiving 404 one or more test entities from the test entity provider. As noted above, receiving 404 a test entity may comprise receiving information about test entity. The information received may depend on various factors such as the type of test entity and/or any attributes of the test entity. As one example, receiving a test entity may include receiving an identifier of a test entity and receiving metadata encoding one or more attributes of the test entity, including, but not limited to, login credentials that enable a system in administering a test to authenticate itself with the system under test using the credentials of the test entity, digital certificates, demographic information and/or other information. As another example, if the test entity is a test product, receiving the test entity may include receiving an identifier of the product and metadata associated with the identifier of the product that includes various attributes of the product. The attributes of the product may include, for instance, price, shipping costs, a uniform resource locator (URL) of a web page associated with the product and/or other information. The web page may, for example, be a web page from which a process for ordering the product may be used. Other metadata associated with the product may include, for example, a pricing model used to offer the product for consumption, one or more values indicating whether or not the product is a product to which the user may subscribe and/or other relevant information.

In an embodiment, process 400 includes administering a test using one or more of the received test entities. For example, as illustrated in FIG. 4, the process 400 includes causing 406 execution of a test script using the received one or more test entities. As noted, the tests can vary widely in scope and may include simulating input by and/or in connection with the test entities. Generally, a test may involve providing input to a system to cause the system to process the input. Upon processing input, one or more results of the test may then be obtained 408. Obtaining the results may be done at various times. For example, if the test involves submitting requests to the system under test, responses to the requests may be obtained as results of the test. As another example, if a test involves causing a system to perform operations resulting in data stored in a data store, data may be accessed from the data store during and/or after administration of the test.

Results of the test may then be analyzed 410 and the analyzed results may then be provided. As with all processes described herein, variations are considered as being within the scope of the present disclosure. For example, a system performing the process 400 may administer the test itself, that is, execute the test script itself in various embodiments or may provide information to another system to enable another system to administer the test. Obtaining 408 results of the test may be performed in various ways which may depend on the test, the system and/or its administration. For example, if the goal of a test is to determine that a correct web page is provided to a user upon certain user input, a result of the test may be a web page provided by the system in response to the input. As another example, if the goal of a test is to determine that a state of a test entity has changed properly as a result of certain input being provided to the system, obtaining results of the test may include accessing data from a data store of the system under test or utilized by the system under test to determine whether the state has changed properly.

Analysis of test results may accordingly vary in numerous ways. For example, in some instances, certain output is identified as expected output. Actual output may then be compared against the expected output to determine whether there is a difference. A report of analyzed results may be provided in various ways. For example, an electronic message encoding whether the test is successful may be provided. Statistical information may be provided in a table and/or in other ways.

Figure 5:
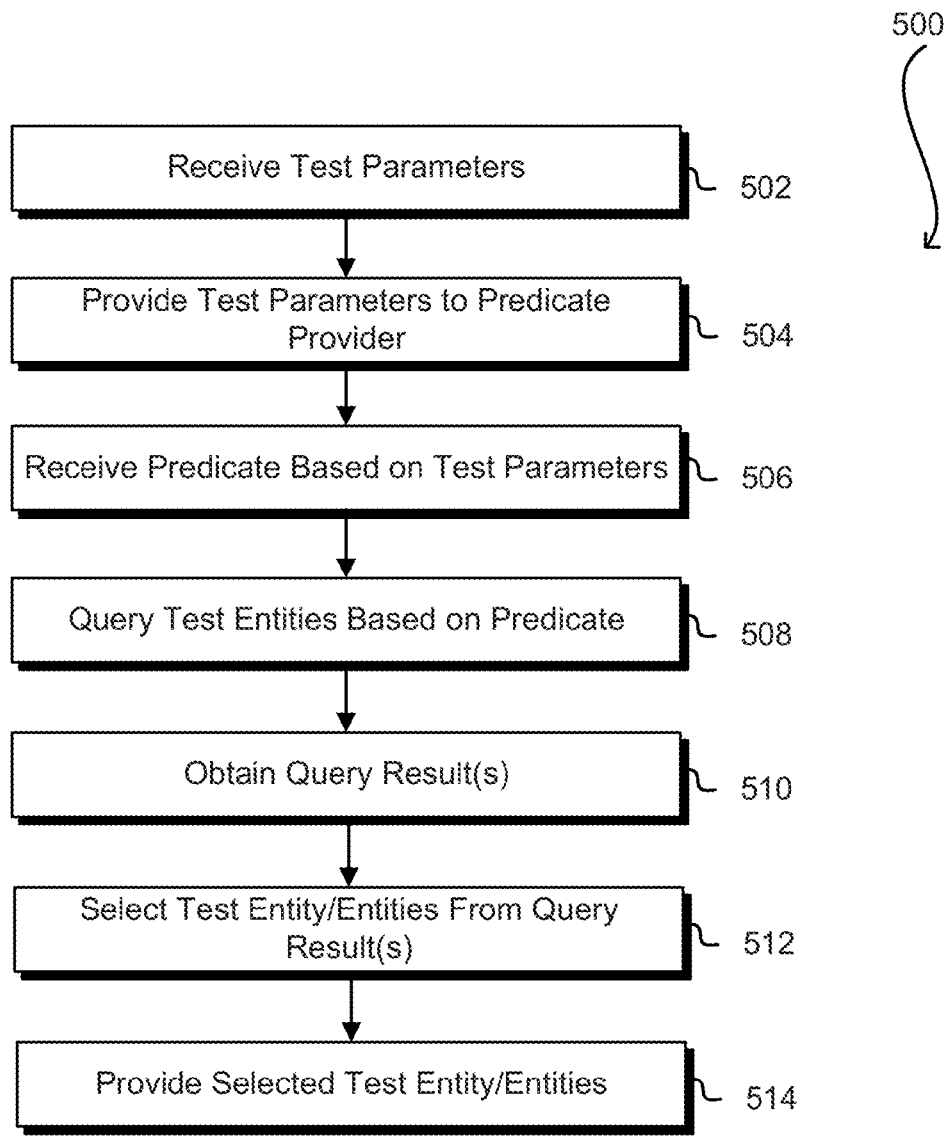
FIG. 5 shows example steps of an illustrative example of a process for providing test entities in accordance with at least one embodiment.

FIG. 5 shows an illustrative example of a process 500 which may be used to provide one or more test entities. The process 500 may be performed, for example, by a test entity provider such as described above. The process 500 may be performed in connection with performance of the process 400 described above or variations thereof. In an embodiment, the process 500 includes receiving 502 test parameters. The parameters may be parameters for a test entity used in a test. The test parameters may be received in any suitable manner. For example, in some embodiments, receiving the test parameters includes receiving the test parameters from another process executing on the same device that is performing the process 500. The test parameters may also be received over a network, such as in embodiments where a test entity provider is implemented separately from a system to whom test entities are provided for use in a test.

In an embodiment, the process 500 includes providing 504 the test parameters to a predicate provider. A predicate provider may be, for example, a predicate provider such as described above in connection with FIG. 3. For instance, the predicate provider may be a computer system or a component of a computer system configured to receive parameters and generate predicates based at least in part on the parameters. As noted, the predicate provider, in some embodiments, is a sub-component of a test entity provider. A predicate may then be received 506 from the predicate provider based at least in part on the test parameters. A set of test entities may then be queried 508 based at least in part on the predicate. Querying the test entities may be performed at any suitable manner which may depend on the particular embodiments being implemented during performance of the process 500. For example, in some embodiments, the predicate is used to form an Xpath query which is executed using a suitable query engine, such as J-query or ExPath depending on the particular implementation. In some embodiments, the query may be a structured query language (SQL) query executed against a database. Generally, querying may vary among the various embodiments and their implementations.

The process 500, accordingly, includes obtaining 510 one or more query results. The query results may include test entities satisfying the query that was used. The query results may be generated in any suitable manner depending on the various embodiments. For example, in some embodiments, the query results are a set of test entities satisfying the query that was submitted based, at least in part, on the predicate. The results may be, for example, all test entities of a pool of test entities that satisfy the query. The query results may also be a subset of a set of all test entities satisfying the query. For example, stochastic or other ways of selecting a subset of results or of test entities satisfying the query may be used.

The process 500 in an embodiment includes selecting one or more test entities from the query results that were obtained 510. It should be noted that in some embodiments, obtaining the query results and selecting the test entities from the query results may be combined. For example, the one or more test entities may be selected as part of generation of the query results which are then obtained. In an embodiment, the process 500 includes providing 514 the selected one or more test entities. Referring to FIG. 3, for example, the selected one or more test entities may be provided from the test entity provider to the tester. As discussed, providing the selected one or more test entities may include providing information representative of the test entities to the tester, such as information needed by the tester to use the selected one or more test entities in a test. As noted, numerous variations are considered within the scope of the present disclosure. For example, one variation includes the obtained query results being provided and one or more test entities being selected from the query results by a device different from the device performing a variation of the process 500.

Various embodiments of the present disclosure also allow for test entities to be checked-out in order to overcome problems with a finite pool of test entities. For example, one such issue may exist when entities can have a state in a system under test. For instance, one test may have a goal of determining whether a user who is not subscribed to a particular product can subscribe to the product. Another test may have a goal of determining whether a user who is subscribed to a particular product can unsubscribe from the product. If the two tests were administered simultaneously using the same test user, test results may be inaccurate. For example, one test includes subscribing and the other test includes unsubscribing which means, if a single test user is allowed to both subscribe to and unsubscribe from the product in two different tests, the results of one or both of the tests may not accurately reflect whether the system operated correctly. In some systems, simultaneous conflicting user input may cause system errors that may not otherwise occur, for example, resulting in a test user not being able to subscribe to or unsubscribe from the product. Generally, use of the same entity in multiple tests can have adverse effects when the tests conflict with one another.

Figure 6:
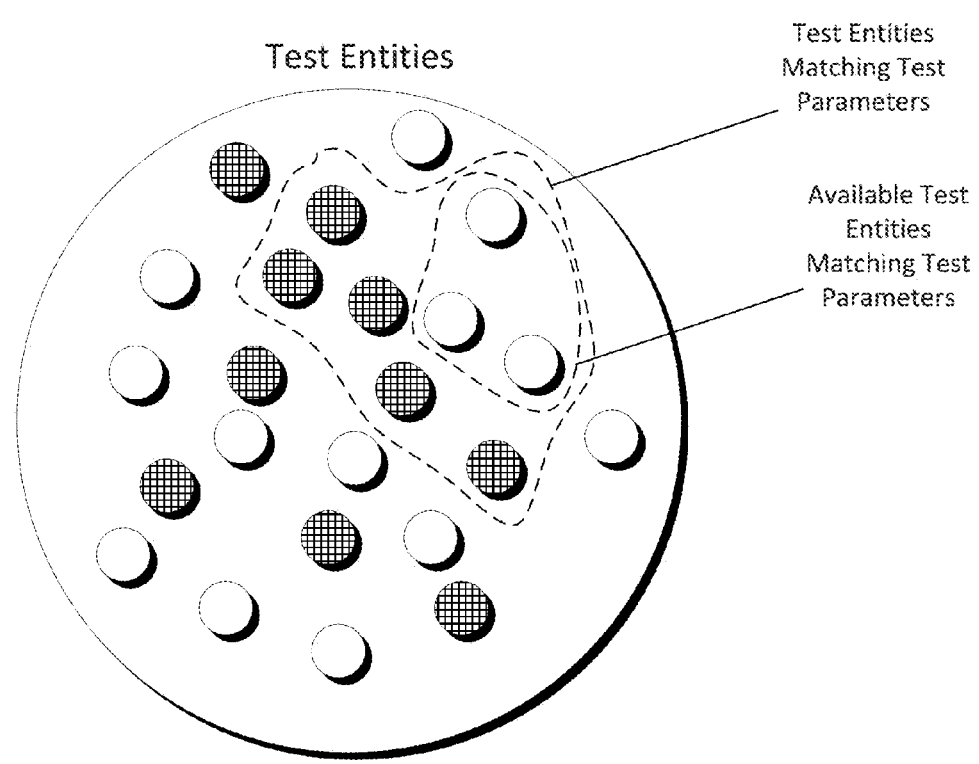
FIG. 6 shows a diagram representing selection of test entities matching a set of parameters in accordance with at least one embodiment.

Accordingly, various embodiments of the present provide techniques for overcoming such deficiencies. In some embodiments, test entities are maintained in a system that allows for the checking in and checking out of the test entities. While a test entity is checked-out, the system may prevent use of the checked-out test entities for all tests or at least for tests where it is determined that use of the test entity in multiple simultaneous tests may cause adverse effects to test result accuracy. FIG. 6, for example, shows an illustrative example of a pool of test entities represented by a large circle in the figure, such as described above in connection with FIG. 2. In this particular example, the test entities are test entities of a particular type represented by dots surrounded by the circle. As with FIG. 2, the test entities in the circle of FIG. 6 include a set of test entities that match a set of test parameters, which may be received such as described above. As illustrated in FIG. 6, test entities are shaded white for test entities that are in a checked-in state and shaded dark when the test entities are in a checked-out state. Thus, a larger area having a parameter of a dotted line illustrated in FIG. 6 surrounds a set of test entities matching the test parameters. A smaller area also surrounded by a dotted line surrounds those test entities which both satisfy the test parameters and which are available for use in a test; that is, which are in a checked-in state. In this manner, if test entities are in a checked-out state because they are being used in another test, a selection process for selecting test entities, in some embodiments, will avoid those test entities in order to provide test entities that, when used in tests, present a lesser danger of conflicting. For example, continuing the example discussed above, the shaded test entities may be currently used in tests regarding subscription to various products. The white test entities may be test entities that are currently not in use for a test and which may, therefore, be available to use in a test involving subscription to various products.

Figure 7:
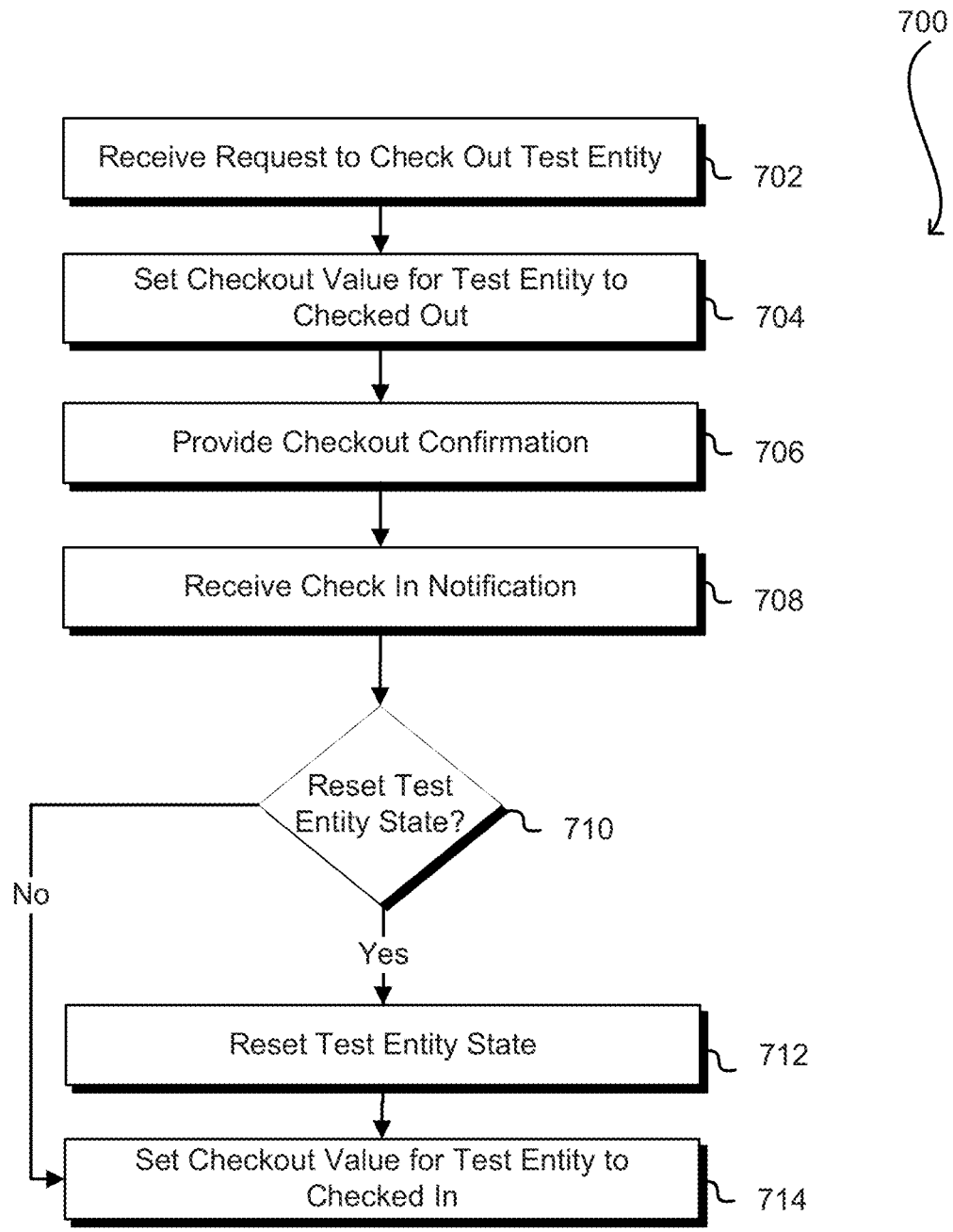
FIG. 7 shows example steps of an illustrative example of a process for checking in and checking out test entities in accordance with at least one embodiment.

FIG. 7 shows an illustrative example of how test entities may be managed in accordance with the illustrative example of FIG. 6. The process 700 may be performed by any suitable device or component of a device, such as a test entity provider or any system that manages one or more pools of test entities. The process 700 in an embodiment includes receiving 700 a request to check out a test entity. The request to check out the test entity may be received in any suitable manner and in a variety of contexts. As an illustrative example, referring to FIG. 3, a tester may submit test parameters in connection with a request for a test entity. Receipt of the request for a test entity may be implicitly treated as a request to check out a test entity. The request to check out the test entity may also be an explicit request to check out a test entity. For instance, a test entity provider, or other component of the environment 300 in FIG. 3, may submit a request to check out a test entity from a system that maintains check in/check out states for test entities, which may be, for example, the test entity provider or another component. The request to check out the test entity may be received as a result of selection of a test entity for use in a test. In an embodiment, the process 700 includes setting 704 a check-out value for the test entity to check out. In this manner, information about the state of the test entity may reflect that the test entity is checked-out. A selection of test entities may avoid selection of the test entity involved if the value is set to checked-out. Checkout confirmation may also be provided to a device that submitted the request to receive the test entity. Providing the checkout confirmation may inform the device that the test entity is suitable for use in a test. Lack of such a confirmation may, for example, indicate that an error has occurred and that corrective action needs to be taken. The test entity may then be used in one or more tests and at some point when finished, a checkin notification may be received 708. The check in notification may be received in any suitable manner. For example, upon completion of a test involving the test entity, a test administration system, tester or other component may notify a device maintaining check-out values for test entities that the test entity is no longer needed for the test. As another example, the checkin notification may be generated and received as a result of a timer having expired. For example, it may be known that tests generally require only a certain amount of time to complete and, therefore, a timer may allow a system performing a process 700 to operate on the assumption that after the expiration of a certain amount of time, the test entity is no longer needed. The checkin notification may also be received in other contexts, such as upon detection of a test being complete.

In an embodiment, the process 700 includes determining 710 whether to reset the test entity state. Metadata maintained for the test entity, for example, may indicate a state for the test entity. As another example, the state may be checked by querying the system for which the state is maintained. In the example involving subscriptions, determining whether to reset the test entity state may be performed by querying the system under test to determine what the test user's state is. The test entity's state may also be determined from test results, such as when a goal of a test is to determine whether the user was able to change its state in the system. Generally, determining whether to reset the state of the test entity may include identifying the test entity's current state and checking the current state against a state in which the test entity should be in when checked-in. If it is determined 710 to reset the test entity state, the test entity state may then be reset 712. Upon resetting 712 the test entity state or upon a determination 710 not to reset the test entity state, the checkout value for the test entity may be set 712 to checked-in. In this manner, with a checkout value for the test entity to be set to be checked-in, the test entity may be again available for selection to be used in a test.

As with all processes described herein, variations are considered as being within the scope of the present disclosure. For instance, the above description of the process 800 involves setting a value that indicates whether a test entity is checked-in or checked-out. Preventing simultaneous use of the same test entity in multiple tests may also be performed in other ways. For example, if a database is used to maintain a pool of test entities, various database techniques may be used. A lock on the test entity, for example, may be used to prevent selection of the test entity until the lock is removed. Transactions and other techniques may also be used.

Figure 8:
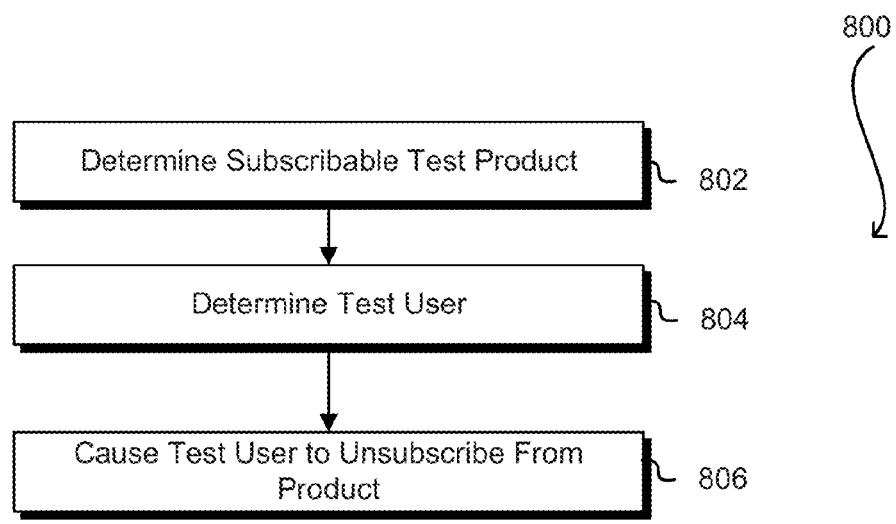
FIG. 8 shows example steps of an illustrative example of a process for testing a system in accordance with at least one embodiment.

As discussed, the various embodiments of the present disclosure involve administration of various tests to systems. FIG. 8 shows an illustrative example of a test that may be administered to a system. In particular, FIG. 8 shows a process 800 for a test of whether a user can unsubscribe from a product in a system. It should be noted that the process 800 illustrated in FIG. 8 is just one of numerous examples of such tests which may be used and as systems evolve and as various complexities change, actual tests applied to a system under test may vary widely from those explicitly provided herein for the purpose of illustration. The process 800 in an embodiment includes determining 802 a test product. Determining the subscribable test product may be performed in any suitable manner, such as described above in connection with determining suitable test entities. For example, parameters for a test product may be provided to a test product provider which may be an implementation of a test entity provider, such as described above, that selects test products from a pool of test products. The parameters for the test product may include a parameter that the product be one to which subscriptions are available. The process 800 as illustrated herein also includes determining 804 a subscribable test user. For example, parameters for a test user may be provided to a test user provider which may be an implementation of a test entity provider, such as described above. The test user provider may operate as described above, but provide test users from a pool of preconfigured test users. Determining the test user may include stochastically selecting a test user from a set of suitable test users useable for the test. In this particular example of FIG. 8, the parameters for the test user may be that the test user be subscribed to a product represented by the determined test product (or any product).

Once the subscribable test product and test user are determined, the process 800 may include causing the determined test user to unsubscribe from the product represented by the determine test product. Causing the user to unsubscribe from the product may include providing input to the system (e.g. requests and authentication information) to simulate a user navigating an interface of the system and unsubscribing. The test may, for instance, include providing login credentials to the system, submitting requests in connection with interface navigation, providing information indicative of selection and unselection of user interface controls and/or other input to the system. While not illustrated, the test may include obtaining information to determine whether the test was successful, i.e., in this case, whether the test user was able to unsubscribe from the product.

Figure 9:
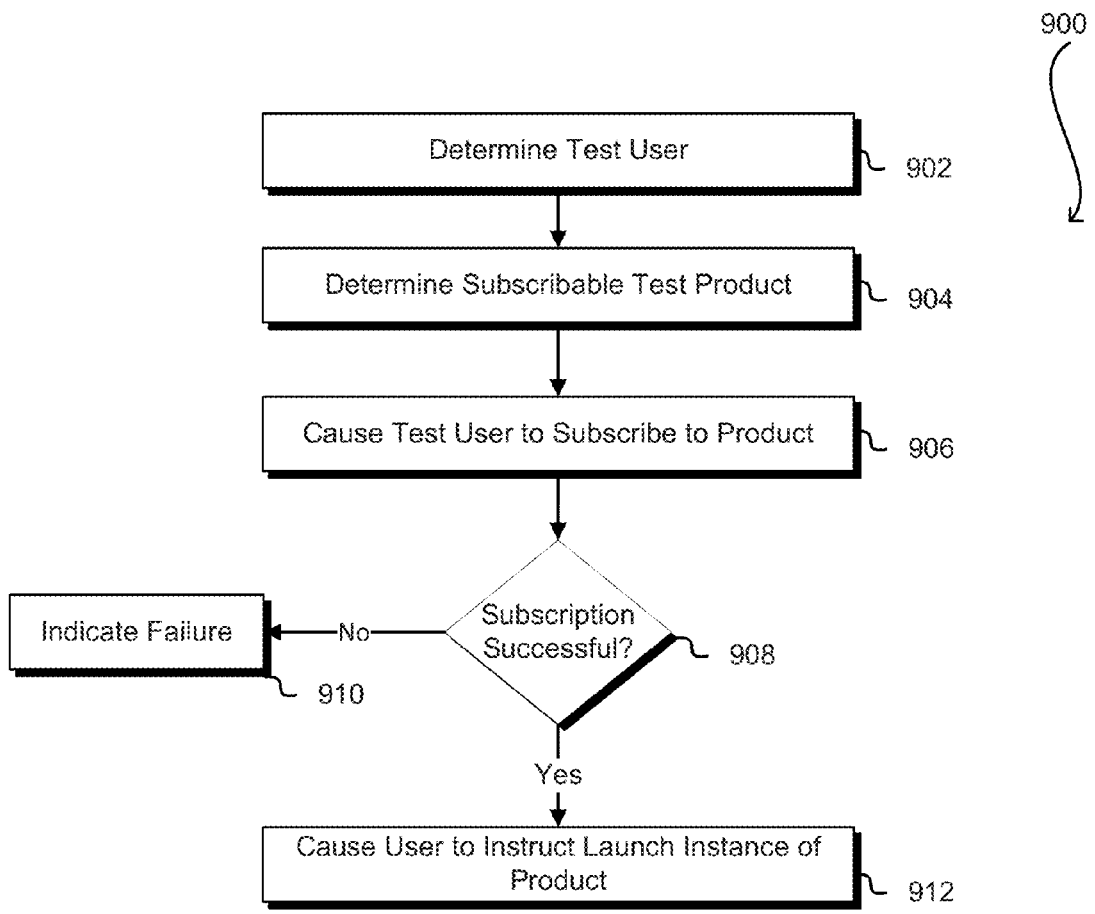
FIG. 9 shows example steps of an illustrative example of a process for testing a system in accordance with at least one embodiment.

FIG. 9 shows another illustrative example of a process 900 which may be used to administer a test on a system in accordance with an embodiment. In this example, the process 900 is for testing a system to determine whether a user can subscribe to a product offered through the system. In this example, the product is a program execution service that hosts virtual computer systems which are remotely and programmatically managed by users. The process 900 illustrates a possible test to determine if a user can subscribe to the service and launch a virtual computer system instance. As illustrated, the process 900 includes determining 902 a test user and determining 904 a subscribable test product, such as described above in connection with FIG. 8. In this example, however, differences may exist due to the nature of the test being performed. For instance, parameters for the test user may be that the test user not be subscribed to the product represented by the test product (or perhaps that the test user not be subscribed to any test product if the test product has not been determined yet).

In an embodiment, the process 900 includes causing 906 the test user to subscribe to the product represented by the determined test product. A determination may then be made 908 whether the subscription was successful. Determining whether the subscription was successful may be performed in any suitable way, such as by querying the system under test for the subscription status or determining if a page received upon submitting a request to subscribe was one expected when subscription is successful. If it is determined 908 that the subscription was unsuccessful, failure of the test may be indicated 910 to the tester, such as in an electronic report, an electronic message, and/or in any suitable manner. If it is determined 909 that the subscription was successful, the test user is caused 912 to launch an instance of the product, in this example, a virtual computer system instance. Causing the user to subscribe to the product and launch an instance of the product may be performed as discussed above, e.g., by providing input to the system in a manner simulating the input being from the test user in order to subscribe to the product and launch an instance of the product. As with the process 800 described above in connection with FIG. 8, test results may be provided in one or more forms.

As discussed, numerous variations are considered as being within the scope of the present disclosure. For example, as discussed above, pools of test entities are treated as probabilistic data sets. Parameters for test entities to be used in tests may be provided with variable amounts of specificity to determine sets of suitable test entities from which to stochastically select for use in tests. Numerous variations of the present disclosure include ways in which pools of test entities are maintained. For example, additions to pools may be made in various ways. In one example, a catalog of items (e.g., a catalogue of items offered for consumption in an electronic marketplace) may be used to generate test entities. Attributes in the catalog may be used as attributes for test entities to generate test entities that are usable for tests. Further, the generated test entities (and, generally, any test entities) may be usable for tests but represent items not actually offered for consumption in an electronic marketplace. For example, some test entities may represent entities that are not publicly consumable in the electronic marketplace, but that are able to be used in tests as if the items were offered for consumption in the electronic marketplace. Test entities may also be used to discover entities from a catalog of entities. Queries based on the parameters for a test may be executed against a catalog to identify entities suitable for the test. Metadata and other information about items in the catalog may be used as test entities and/or added to a pool of test entities.

As another example, test entities may be generated using stochastic methods to determine attributes for test entities. For instance, a basis test entity may be used to generate multiple other test entities. The basis test entity may include some basic information (e.g., a username, password and/or other credentials) and stochastic methods may be used to populate values for other attributes. Building pools in this manner may be performed at any suitable time, such as before such test entities are needed for a test or dynamically, when test entities are requested.

For example, in some embodiments, a user may generate test entities or basis test entities for addition to the pool. As one example, a test administrator may request a test entity provider for a test entity. In some instances, a test entity satisfying specified parameters may not be available or one or more test entities may not be suitable (e.g., because the test entity was already used for the test and more variation in the test entities is desirable). In such instances, the test entity may be created for the test and added to the pool for use in future tests. Test entities may also be created and added to the pool at other times. For example, test entities may be preemptively created when it is known that test entities with certain attributes are going to be needed to test a product or service or new system configuration.

In addition, test users and test products are used throughout the present disclosure as illustrative examples of test entities. As noted, other test entities are considered as being within the scope of the present disclosure. For example, test users are provided as example test entities for which input to a system under test is provided in accordance with administration of a test. For instance, input to a system under test may be provided in a manner simulating the test users directly or indirectly (e.g., through user devices) providing input to the system. Other test entities may also provide input to a system under test. For example, a test entity may represent a non-human entity, such as a system that interacts with a system under test. Input to the system may, for example, simulate the system represented by the test entity making API or other calls to the system under test. A test entity may also represent a subsystem of a system under test. As just one illustrative example, a test entity may represent a virtual computer system hosted by a system under test and a test may include simulating input from the virtual computer system.

Numerous other examples are also considered as being within the scope of the present disclosure. For example, in some embodiments, test entities are provided as a service. In one example, a computing resource provider may host computing resources (virtual computer systems, data storage devices, and/or other resources) that are programmatically managed by customers of the computing resource provider. The customers may, for instance, use the computing resources to implement infrastructure hosted by the computing resource provider. The customers may, for example, have networks of devices operating together in support of the customers' operations including internal and/or external operations. The above techniques may be utilized to provide the customers' test entities that can be used by the customers to test their own infrastructure. In this manner, customers can achieve the above benefits of stochastic selection of entities to use in tests without having to maintain the test entities themselves. Generally, test entities may be provided to any customer who is able to use the test entities in their own systems.

Figure 10:
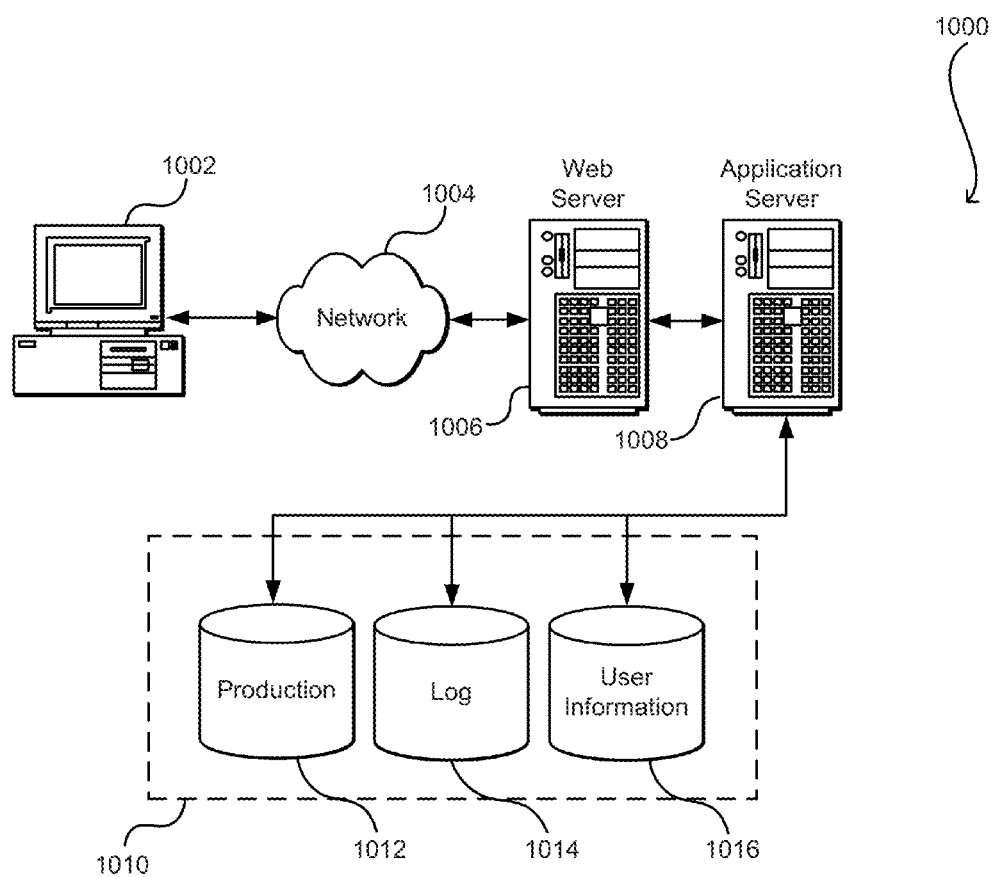
FIG. 10 shows an illustrative example of an environment in which various embodiments may be implemented.

FIG. 10 illustrates aspects of an example environment 1000 for implementing aspects in accordance with various embodiments. As will be appreciated, although a Web-based environment is used for purposes of explanation, different environments may be used, as appropriate, to implement various embodiments. The environment includes an electronic client device 1002, which can include any appropriate device operable to send and receive requests, messages or information over an appropriate network 1004 and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 1006 for receiving requests and serving content in response thereto, although for other networks an alternative device serving a similar purpose could be used as would be apparent to one of ordinary skill in the art.

The illustrative environment includes at least one application server 1008 and a data store 1010. It should be understood that there can be several application servers, layers, or other elements, processes or components, which may be chained or otherwise configured, which can interact to perform tasks such as obtaining data from an appropriate data store. As used herein the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device, handling a majority of the data access and business logic for an application. The application server provides access control services in cooperation with the data store, and is able to generate content such as text, graphics, audio and/or video to be transferred to the user, which may be served to the user by the Web server in the form of HyperText Markup Language ("HTML"), Extensible Markup Language ("XML") or another appropriate structured language in this example. The handling of all requests and responses, as well as the delivery of content between the client device 1002 and the application server 1008, can be handled by the Web server. It should be understood that the Web and application servers are not required and are merely example components, as structured code discussed herein can be executed on any appropriate device or host machine as discussed elsewhere herein.

The data store 1010 can include several separate data tables, databases or other data storage mechanisms and media for storing data relating to a particular aspect. For example, the data store illustrated includes mechanisms for storing production data 1012 and user information 1016, which can be used to serve content for the production side. The data store also is shown to include a mechanism for storing log data 1014, which can be used for reporting, analysis or other such purposes. It should be understood that there can be many other aspects that may need to be stored in the data store, such as for page image information and to access right information, which can be stored in any of the above listed mechanisms as appropriate or in additional mechanisms in the data store 1010. The data store 1010 is operable, through logic associated therewith, to receive instructions from the application server 1008 and obtain, update or otherwise process data in response thereto. In one example, a user might submit a search request for a certain type of item. In this case, the data store might access the user information to verify the identity of the user, and can access the catalog detail information to obtain information about items of that type. The information then can be returned to the user, such as in a results listing on a Web page that the user is able to view via a browser on the user device 1002. Information for a particular item of interest can be viewed in a dedicated page or window of the browser.

Each server typically will include an operating system that provides executable program instructions for the general administration and operation of that server, and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available, and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 10. Thus, the depiction of the system 1000 in FIG. 10 should be taken as being illustrative in nature, and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python or TCL, as well as combinations thereof. The server(s) may also include database servers, including without limitation those commercially available from Oracle, Microsoft®, Sybase® and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this disclosure are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. A computer-implemented method for testing systems, comprising:
    under the control of one or more computer systems configured with executable instructions,
    obtaining parameters for a test to be performed on a test system, the parameters including a set of test user parameters and a set of test product parameters;
    selecting, from a set of preconfigured test users available for selection, a test user satisfying the test user parameters, the selected test user being associated with information that enables an administrative system to simulate the selected test user providing user input to the test system;
    selecting, from a set of preconfigured test products available for selection, a test product satisfying the test product parameters; and
    administering, by the administrative system, the test by at least providing input to the test system using the information, wherein the input simulates the selected test user providing the user input to the test system to engage in one or more transactions involving an item represented by the test product.

2. The computer-implemented method of claim 1, wherein:
    the selected test user comprises a test user identifier and a plurality of attributes that satisfy the test user parameters; and
    the selected test product comprises a test product identifier and a plurality of attributes that satisfy the test product parameters.

3. The computer-implemented method of claim 1, wherein:
    selecting the test user requires the test user to be available for selection; and
    the method further comprises:
    making, during at least administration of the test, the selected test user unavailable for selection to use in another test; and
    making the selected test user available for use in the another test after the administration of the test.

4. The computer-implemented method of claim 1, wherein:
the test user has a state maintained by the test system; and
at least one of the test user parameters are based at least in part on the state.

5. The computer-implemented method of claim 4, wherein administering the test further includes providing input to the test system that causes the test system to change the state.

6. The computer-implemented method of claim 1, wherein selecting the test user and selecting the test product are both performed stochastically.

7. A computer-implemented method for system testing, comprising:
under the control of one or more computer systems configured with executable instructions,
receiving a request that specifies one or more test entity parameters;
selecting, based at least in part on the one or more test entity parameters, a test entity from a set of test entities available for performing a test on a system, an individual test entity of the set of test entities having a set of attributes determinative of whether the individual test entity satisfies the one or more test entity parameters; and
making the selected test entity available for use to perform the test on the system.

8. The computer-implemented method of claim 7, wherein selecting the selected test entity includes stochastically selecting the selected test entity from a plurality of test entities satisfying the one or more test entity parameters.

9. The computer-implemented method of claim 7, wherein the selected test entity represents an entity from which the system is configured to receive input for processing by the system.

10. The computer-implemented method of claim 9, wherein the selected test entity includes a user of the system.

11. The computer-implemented method of claim 7, wherein:
the selected test entity includes a state of multiple available states in the system; and
the one or more test entity parameters are based at least in part on the state of the multiple available states.

12. The computer-implemented method of claim 7, wherein:
the set of test entities is a set of test entities of a first test entity type; and
the method further comprises:
selecting, based at least in part on the one or more test entity parameters, a second test entity from a second set of test entities available for selection, wherein test entities of the first set of test entities include a first test entity type and test entities of the second set of test entities include a second, different test entity type; and
providing the selected second test entity.

13. A system for testing another system, comprising:
one or more processors; and
memory including instructions that, when executed by the one or more processors, cause the system to implement at least a test entity provider that:
receives one or more test entity parameters for selecting a test entity for performing a test on the another system;
selects, based at least in part on the one or more test entity parameters, the test entity from a set of test entities available for performing the test on the another system, an individual test entity of the set of test entities having a set of attributes determinative of whether the individual test entity satisfies the one or more test entity parameters; and
provides information about the test entity to enable use of the test entity to perform the test on the another system.

14. The system of claim 13, wherein:
the instructions, when executed by the one or more processors, further cause the system to implement a predicate provider that provides predicates based at least in part on parameters provided to the predicate provider; and
selecting the test entity includes:
providing the one or more test entity parameters to the predicate provider;
receiving a predicate based at least in part on the one or more test entity parameters; and
querying, with a query that is based at least in part on the received predicate, a data store that stores the set of test entities available for selection.

15. The system of claim 13, wherein selecting the test entity includes stochastically selecting the test entity from a subset of the set of test entities.

16. The system of claim 13, wherein the test entity represents an entity from which the another system is configured to receive and process input.

17. The system of claim 13, wherein the instructions, when executed by the one or more processors, further cause the system to administer the test to the another system.

18. The system of claim 13, wherein:
the test entity has a state in the another system;
the test includes one or more transactions with the another system that changes the state; and
the instructions, when executed by the one or more processors, further cause the system to make the test entity unavailable for other tests during at least administration of the test.

19. A computer-readable storage medium having stored thereon instructions that, when executed by one or more processors of a first system, cause the first system to:
provide one or more parameters for selecting a test entity;
receive information about the test entity satisfying the one or more parameters that enables the first system to simulate, to a second system, input from an entity represented by the test entity; and
cause a test to be administered to the second system using the information about the test entity, the test including the input to the second system.

20. The computer-readable storage medium of claim 19, wherein:
providing the one or more parameters includes providing the one or more parameters to a test entity provider that maintains a pool of test entities; and
receiving the information about the test entity includes receiving the information from the test entity provider.

21. The computer-readable storage medium of claim 20, wherein the test entity provider is a component of the first system.

22. The computer-readable storage medium of claim 19, wherein:
providing the one or more parameters includes providing one or more parameters for a first test entity type and one or more parameters for a second test entity type;
the test entity is of a first test entity type; and
receiving the information about the test entity further includes receiving additional information about a second test entity of the second test entity type.

23. The computer-readable storage medium of claim 19, wherein the instructions, when executed by the one or more processors, further cause the first system to provide a notification that use of the test entity is complete.

24. The computer-readable storage medium of claim 19, wherein the input to the first system causes the second system to change a state maintained by the second system for the test entity.

* * * * *